(12) United States Patent
Doehler

(10) Patent No.: US 6,209,482 B1
(45) Date of Patent: *Apr. 3, 2001

(54) LARGE AREA MICROWAVE PLASMA APPARATUS WITH ADAPTABLE APPLICATOR

(75) Inventor: Joachim Doehler, Union Lake, MI (US)

(73) Assignee: Energy Conversion Devices, Inc., Troy, MI (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/942,308

(22) Filed: Oct. 1, 1997

(51) Int. Cl.[7] .................................................. C23C 16/00
(52) U.S. Cl. ............................... 118/723 MW; 156/345
(58) Field of Search ....................... 118/723 MW, 118/723 ME, 723 MR, 723 MA; 156/345; 315/111.21; 204/298.38

(56) References Cited

U.S. PATENT DOCUMENTS

| | | | |
|---|---|---|---|
| 3,860,891 | * | 1/1975 | Hiramatsu .......................... 333/21 R |
| 4,893,584 | * | 1/1990 | Doehler et al. ........................ 118/723 |
| 5,328,515 | * | 7/1994 | Chouan et al. ................. 118/723 ME |
| 5,545,258 | * | 8/1996 | Katayama et al. ............ 118/723 MP |
| 5,670,224 | * | 9/1997 | Izu et al. .............................. 428/35.8 |
| 5,804,923 | * | 9/1998 | Iio et al. .......................... 315/111.21 |
| 5,843,236 | * | 12/1998 | Yoshiki et al. ............... 118/723 MR |

OTHER PUBLICATIONS

Riverside Webster's II New College Dictionary, Houghton Miffin Company, U. S. A. p. 912, 1995.*

* cited by examiner

*Primary Examiner*—Gregory Mills
*Assistant Examiner*—Luz Alejandro
(74) *Attorney, Agent, or Firm*—Philip H. Schlazer; Marvin S. Siskind

(57) ABSTRACT

A microwave apparatus for sustaining a substantially uniform plasma over a relatively large area. The microwave apparatus comprises a vacuum vessel for sustaining the plasma in a plasma region thereof. The apparatus further comprises a nonevanescent microwave applicator having means for controlling the cutoff frequency thereof. The microwave applicator may comprise a waveguide and a volume of dielectric material disposed within the waveguide. Alternately, the microwave applicator may comprise ridge waveguide.

12 Claims, 5 Drawing Sheets

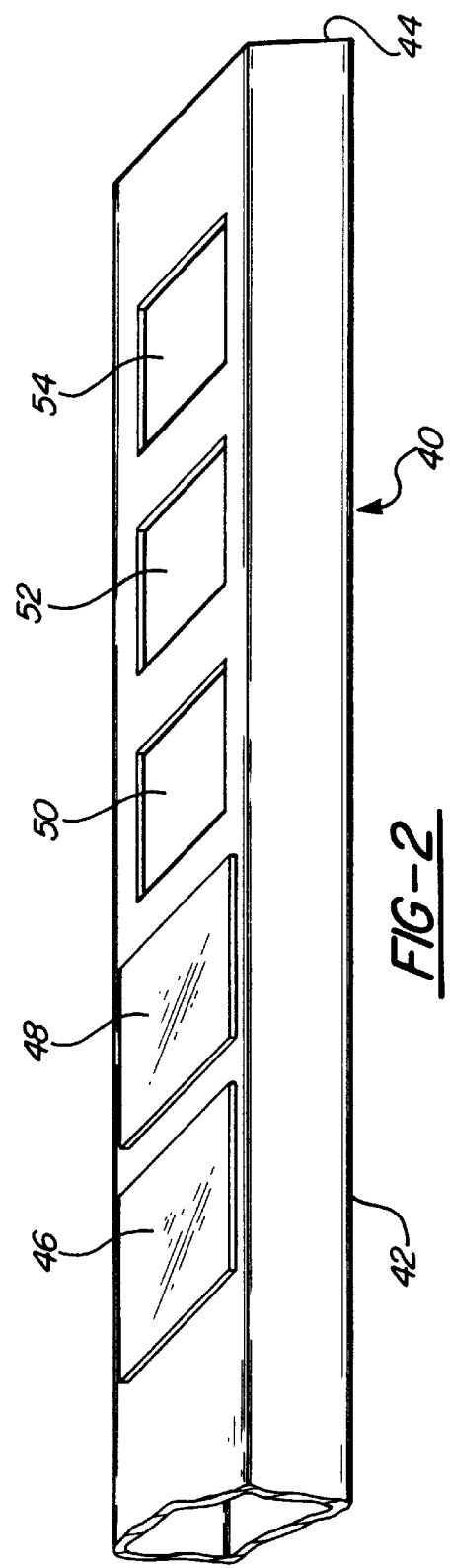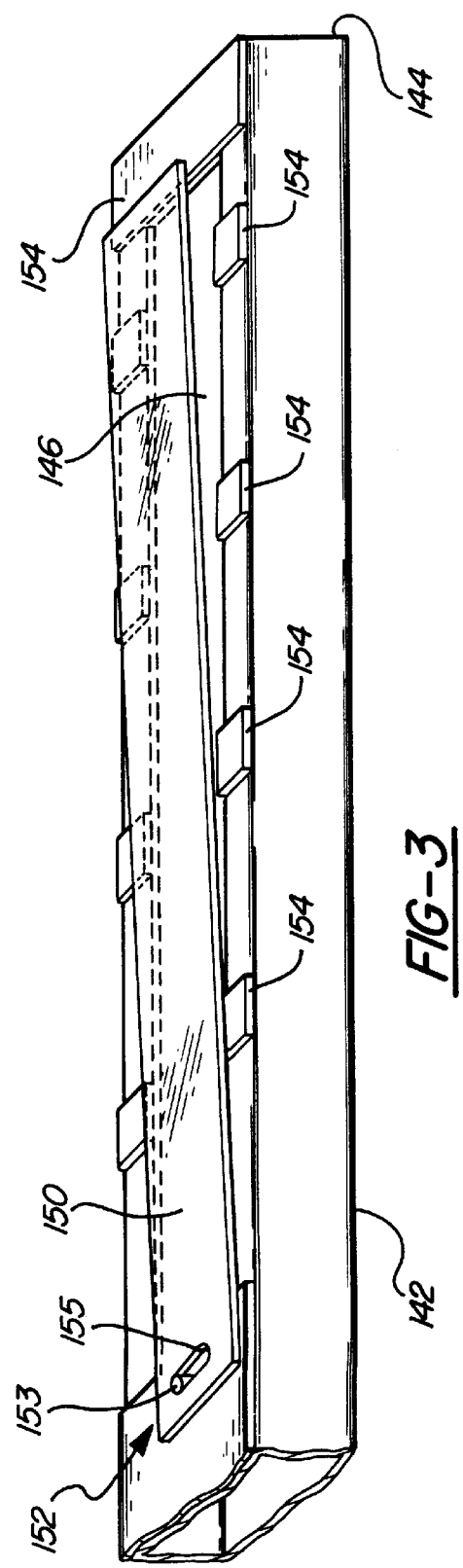

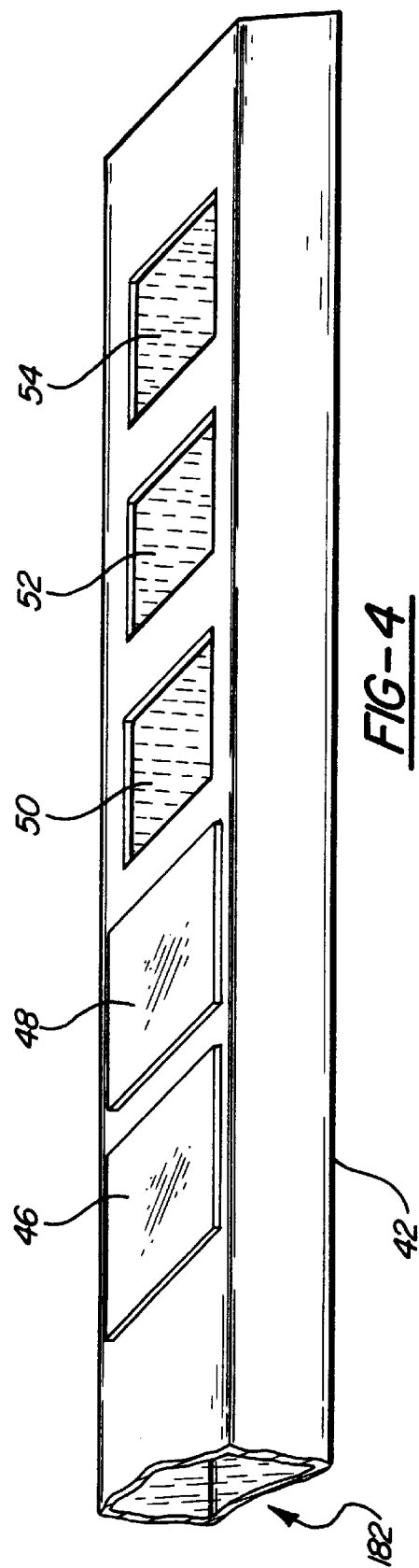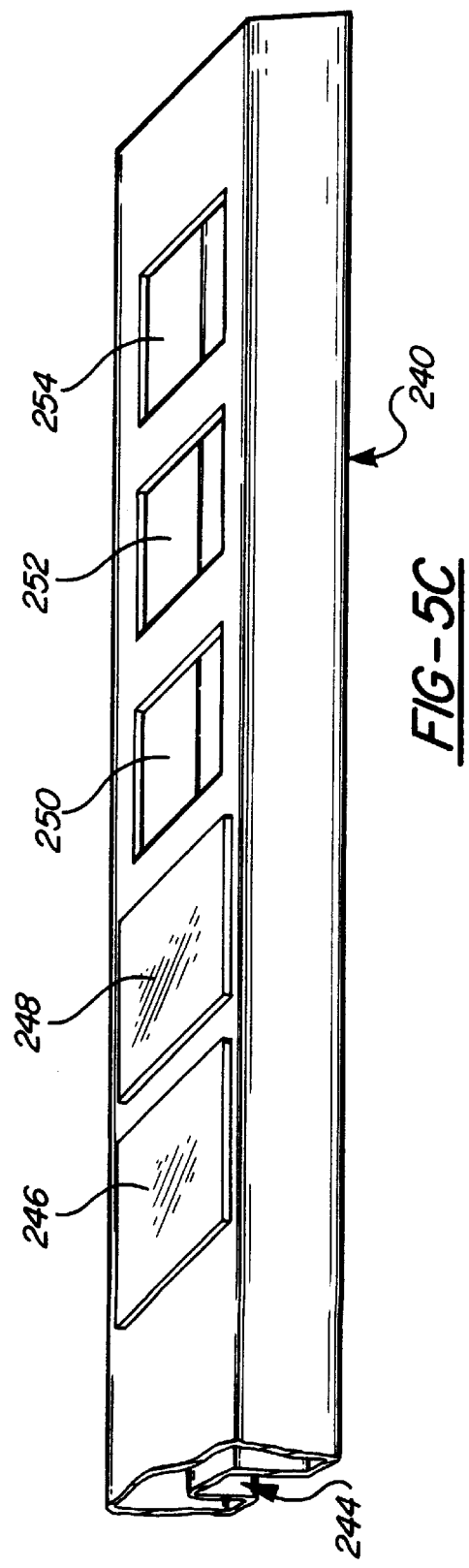

LARGE AREA MICROWAVE PLASMA APPARATUS WITH ADAPTABLE APPLICATOR

FIELD OF THE INVENTION

The instant invention relates to a microwave energy apparatus for sustaining a substantially uniform plasma over a relatively large area. The microwave apparatus includes a microwave applicator that can be adapted for use at different microwave wavelengths.

BACKGROUND OF THE INVENTION

As a result of the knowledge gained by the mass production of microwave ovens, the per kilowatt cost of microwave energy sources has fallen rapidly, opening a broad range of new applications in both commercial and industrial settings. One application is the use of microwave energy to initiate and sustain plasmas for use in plasma treatment processes, semiconductor etching, thin film deposition processes, and other processes.

While the conventional microwave oven is designed to be adequate to uniformly heat food products through the use of mechanical means to average out microwave energy non-uniformities and while taking advantage of the relatively long thermal relaxation times of the food products being heated, the same techniques cannot be used for uniformly exciting gases to create a plasma because of their short relaxation times. The fans and other mechanical "microwave dispersers" used in oven technology, are unable to assure a uniform dispersion of microwave energy, on a time scale appropriate to plasma excitation. To accomplish the uniform microwave excitation of a plasma other means have been employed.

U.S. Pat. Nos. 4,517,223 and 4,504,518 to Ovshinsky, et al, the disclosures of which are incorporated herein by reference, describe processes for the deposition of thin films onto small area substrates in a low pressure, microwave glow discharge plasma. Operation in the disclosed low pressure regimes not only eliminates powder and polymeric formations in the plasma, but also provides the most economic mode of plasma deposition. These patents describe low pressure and high energy density deposition utilizing microwave energy (i.e., near the minimum of the Paschen curve). However, the problem of uniformity of deposition over large areas remains unaddressed.

U.S. Pat. No. 4,729,341 to Fournier, et al, the disclosure of which is incorporated by reference, describes a low pressure microwave plasma process for depositing a photoconductive semiconductor thin film on a large area cylindrical substrate using a pair of radiative waveguide applicators in a high power process. The principles are limited to cylindrically shaped substrates, such as electrophotographic photoreceptors, and are not directly transferable to large area, generally planar substrates.

In an attempt to provide greater uniformity in the microwave energy radiated from the microwave applicators (and hence a more uniform deposition over a large planar surface), various "slow wave" microwave structures have been proposed.

U.S. Pat. No. 3,814,983 to Weissfloch and U.S. Pat. No. 4,521,717 to Kieser, the disclosures of which are incorporated herein by reference, both address the problem of non-uniformity by proposing various spatial relationships between the microwave applicator and the substrate being processed. Weissfloch discloses a slow wave waveguide structure that is inclined at an angle with respect to the substrate. Kieser discloses the use of two waveguide structures in an anti-parallel arrangement that superimposes the energy inputs of the two waveguides. This structure, however, results in an inefficient coupling of microwave energy into the plasma. Generally, the slow wave structures result in a rapid fall off of microwave energy as a function of distance transverse from the microwave applicator, leading to an inefficient coupling of microwave energy into the plasma.

The issue of microwave and plasma uniformity was also treated by J. Asmussen in "LOW TEMPERATURE OXIDATION OF SILICON USING A MICROWAVE PLASMA DISC SOURCE", J. Vac. Sci. Tech. B-4 (January-February 1986) pp. 295–298 and by M. Dahimene and J. Asmussen in "THE PERFORMANCE OF MICROWAVE ION SOURCE IMMERSED IN A MULTICUSP STATIC MAGNETIC FIELD" J. Vac. Sci. Tech. B-4 (January-February 1986) pp. 126–130. Asmussen describes a microwave reactor referred to as a microwave plasma disc source ("MPDS"). The plasma is in the shape of a disc or tablet having dimensions proportional to microwave wavelength. The plasma geometry is scalable to large diameters, potentially yielding a uniform plasma density over a large surface area. Asmussen describes a microwave plasma disc source which is designed for operation at 2.45 gigahertz, where the plasma confined diameter is 10 centimeters and the plasma volume is 118 cubic centimeters.

U.S. Pat. No. 4,481,229 to Suzuki, et al describes the use of electron cyclotron resonance to obtain a plasma having a relatively high degree of uniformity over a limited surface area. However, Hitachi fails to teach or suggest a method by which large area plasmas may be achieved.

U.S. Pat. Nos. 4,517,223 and 4,729,341, referred to above, describe the necessity of using very low pressures in very high microwave power density plasmas. Low pressure is needed to obtain high deposition rates and/or high gas utilization, and to economically carry out the plasma processes. However, the relationship between high deposition rates, high gas utilization, high power density, and low pressure further limits the utility of slow wave structures and electron-cyclotron resonance methods.

U.S. Pat. No. 4,893,584 to Doehler et al, the disclosure of which is incorporated herein by reference, discloses a microwave energy apparatus adapted to sustain a substantially uniform plasma over a relatively large area. The '584 Patent discloses a "leaky" microwave applicator structure whereby microwave energy is allowed to leak or radiate from the applicator through a plurality of apertures. The microwave energy apparatus disclosed by Doehler obviates the shortcomings inherent in slow wave microwave structures.

In generating a uniform, linear microwave plasma for the purpose of thin film deposition, the electric field strength of the microwave radiation that is coupled to the plasma is important in determining the size and the density of the plasma as well as in determining the thin film deposition rate onto a substrate.

One way of increasing the electric field strength within the plasma region is to increase the power capabilities of the microwave energy source. When the microwave source being used is a magnetron, the power of the microwave energy produced is proportional to the size of the device. However, increasing the size of the magnetron also increases the wavelength of the microwave energy generated, resulting in the need to increase the dimensions of the microwave applicator as well as many other parts of the apparatus.

In general, such dimensional changes are very costly. As well, they are impractical and may detrimentally effect the proper operation of the equipment. Hence, a microwave energy apparatus is needed that incorporates a more robust microwave applicator that can be easily adapted to changes in the wavelength of the microwave energy used.

BRIEF SUMMARY OF THE INVENTION

An objective of the present invention is to provide a microwave apparatus for sustaining a substantially uniform plasma over a relatively large area that can be easily adapted for use at various microwave frequencies. Another objective of the present invention is to provide a microwave applicator that may be used at different microwave frequencies without having to undergo dimensional change.

These and other objects of the invention are satisfied by a microwave apparatus for sustaining a substantially uniform plasma over a relatively large area, comprising: a vacuum vessel for sustaining the plasma in a plasma region thereof; means, within the vacuum vessel, for supporting a substrate in juxtaposition to the plasma region; means for maintaining the vacuum vessel at a desired pressure; means for introducing process gases into the vacuum vessel; a nonevanescent microwave applicator having means for controlling the cutoff wavelength thereof, the applicator extending at least partially within the vacuum vessel and radiating microwave energy from a source into the interior of the vessel; and means for gaseously isolating the microwave applicator from the plasma region.

The microwave applicator may comprise a waveguide having an elongated surface extending along a longitudinal axis thereof, and a volume of dielectric material disposed within the waveguide. Alternately, the microwave applicator may comprise a ridge waveguide having an elongated surface extending along a longitudinal axis thereof.

BRIEF DESCRIPTION OF THE DRAWINGS

FIG. 2 shows a microwave applicator with a plurality of spacedly disposed apertures;

FIG. 3 shows a microwave applicator with a single elongated aperture and shutter means;

FIG. 4 shows a shows a microwave applicator including dielectric material;

FIG. 5c shows a microwave applicator formed from a single-ridge waveguide, where the applicator has a plurality of spacedly disposed apertures;

DETAILED DESCRIPTION OF THE INVENTION

The instant invention is a microwave energy apparatus for sustaining a substantially uniform plasma within an evacuated vessel. By maintaining the vessel at sub-atmospheric pressures, it is possible to operate the plasma at a pressure approximately that required for operation near the minimum of the modified Paschen curve, as defined in U.S. Pat. No. 4,504,518, col. 16, lines 44–52. Low pressure also allows for a longer mean free path of travel for the plasma excited species, thereby contributing to overall plasma uniformity. In this way, it is possible for the microwave energy apparatus to sustain a uniform plasma reaction upon a substrate disposed within the near field distance of the microwave source.

Figure 1:
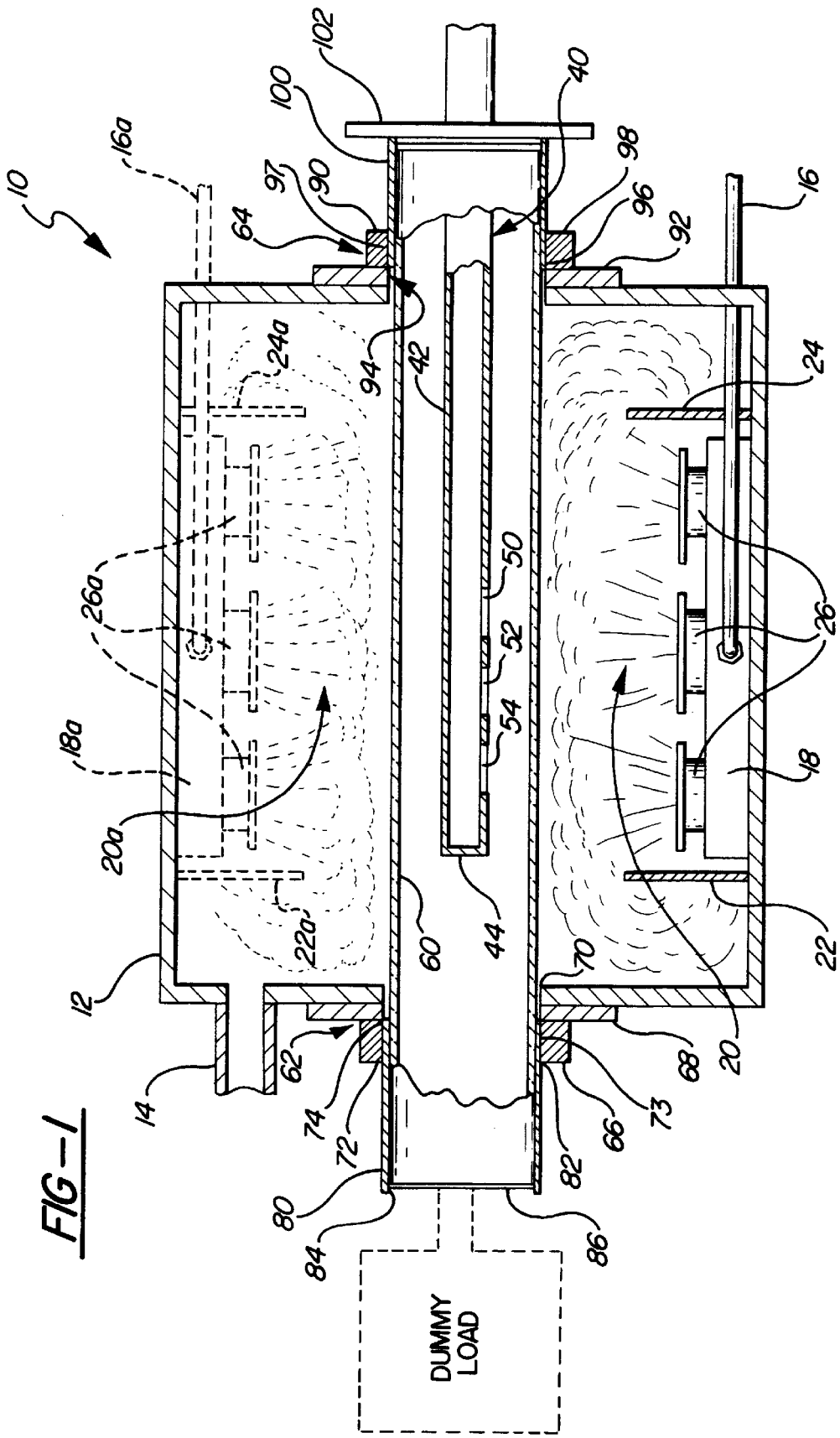
FIG. 1 shows the components of the microwave energy apparatus of the instant invention operatively disposed for effecting a uniform microwave plasma across an elongated, large area distance.

FIG. 1, illustrates a cross-sectional view of microwave energy apparatus 10 for sustaining a substantially uniform microwave plasma over a relatively large area. A "large area" is defined herein as a body having at least one dimension greater than one microwave wavelength, and preferably greater then twelve inches. The apparatus 10 includes, inter alia, a vacuum vessel 12, the walls of which are preferably formed of a corrosion resistant material such as stainless steel. The vacuum vessel 12 further includes a pump-out port 14 adapted for suitable connection to a vacuum pump provided to maintain the interior of the vacuum vessel 12 at an appropriate sub-atmospheric pressure (vacuum) to sustain the plasma process therein. The vacuum pump is further adapted to remove reaction products from the interior of said vessel 12.

The vessel 12 further includes at least one process gas input line 16 connected to a process gas input manifold 18 disposed so as to uniformly distribute process gases into the interior of the reaction vessel 12, and specifically into the plasma region 20 of the vacuum vessel 12. The process gas input manifold 18 is operatively disposed between at least a pair of process gas containment means 22 and 24. The process gas containment means 22, 24 contain the process gas introduced by the manifold 18 into the plasma region 20 of the vacuum vessel 12. Also present within the plasma region 20 are means for supporting a substrate or substrates 26. Though not shown, the vacuum vessel 12 may further include means for maintaining the substrate at a desired temperature, e.g., heating means or cooling means.

The substrate may include, but is not limited to, a single elongated member, a plurality of small substrates or a continuous web of substrate material. While the plasma region 20 is disposed at the bottom of the vacuum vessel 12, due to the highly uniform nature of the plasma sustained by the microwave energy apparatus 10, the plasma region 20 may in fact be located on the top, bottom or sides of the vacuum vessel 12. As shown in FIG. 1 in phantom, the plasma region 20a may be located anywhere within the vessel 12. The substrate may be located at any distance from the microwave plasma source. Preferably, it is located a distance from the plasma source which does not exceed the near field distance of the microwave plasma source. This allows for relatively high gas utilization rates.

The microwave energy apparatus 10 further includes a microwave applicator 40 which extends at least partially into the interior of the vacuum vessel 12. The microwave applicator 40 accepts microwave energy that is transmitted from a microwave source, such as a magnetron. The applicator 40 propagates the energy for a short distance and radiates the energy into the interior of the vacuum vessel 12. The microwave applicator of the present invention radiates microwave energy via "nonevanescent" waves and, hence, is a nonevanescent microwave applicator. The microwave energy initiates and maintains a plasma of the process gases introduced into the vessel 12 by the process gas manifold 18.

The microwave applicator 40 behaves as a transmission line for the microwave energy. Associated with the applicator is a "cutoff" wavelength whereby microwaves with wavelength longer than the cutoff wavelength will not propagate. The microwave applicator disclosed herein includes means for controlling the cutoff wavelength. Preferably, the means for controlling the cutoff wavelength can at least double the cutoff wavelength. More preferably, the means for controlling the cutoff wavelength can at least triple the cutoff wavelength.

In one embodiment of the invention, the microwave applicator 40 includes a waveguide 42 having an elongated surface extending along a longitudinal axis of the waveguide. The microwave applicator further includes a volume of dielectric material disposed within the waveguide. As will be explained below, the volume of dielectric material functions as the means for controlling the cutoff wavelength of the microwave applicator.

In the embodiment shown in FIG. 1, the waveguide 42 is a rectangular waveguide (i.e. the cross-sectional shape of the waveguide 42 is rectangular). However, the waveguide 42 may also be a square waveguide, circular waveguide, or elliptical waveguide (i.e., the cross-sectional shape may be square, circular, or elliptical, respectively). Waveguide having other cross-sectional shapes may also be used.

The waveguide surface is preferably formed from a conductive material. Examples of such materials include, but are not limited to, silver, copper, brass, or aluminum. The waveguide surface is preferably rigid, but it may also be flexible and twistable.

Preferably, the terminal end of the waveguide 42 that extends into the vacuum vessel is an open end 44 adapted to avoid standing waves. Alternatively, the terminal end of waveguide 42 may be sealed.

The waveguide 42 includes an aperture means that is formed in the surface of the waveguide for emitting the microwave energy from the interior of the waveguide and into the vacuum vessel. Preferably, the aperture means is adapted to uniformly radiate microwave energy into the vacuum vessel. The aperture means may be a single aperture. The single aperture is preferably elongated along the longitudinal extent of the waveguide surface. Alternately, the aperture means may be a plurality of apertures which are spacedly positioned along the longitudinal extent of the waveguide surface. In the case of a rectangular or square waveguide, the aperture means may be positioned on a single face of the waveguide surface. Alternately, the aperture means may be positioned on more than one of the faces of the waveguide surface.

FIG. 2 shows waveguide 42 having terminal end portion 44, and a plurality of spacedly disposed apertures, 46, 48, 50, 52 and 54 formed through a single face of the waveguide surface. One or more of the apertures may be either totally or partially blocked, as by waveguide material, to control the density and distribution of microwave energy radiating from the waveguide 42. Selective blocking provides a way to sustain a substantially uniform plasma. In FIG. 2, apertures 46 and 48 are shown blocked.

The leak rate through any one of the apertures is dependent upon the size of that aperture. Generally, the size of the aperture may be either larger or smaller than a wavelength of microwave energy.

As discussed, the aperture means may be a single aperture that is elongated along the longitudinal extent of the waveguide surface. This embodiment is shown in FIG. 3 as aperture 146. In this embodiment, aperture 146 is formed through substantially the entire length and width of a single face of the rectangular waveguide 142.

In the single aperture 146 shown in FIG. 3, the concentration of microwave energy radiating from the aperture 146 is greatest at the end of the aperture nearest the source of microwave energy. The microwave applicator may further include a shutter means for blocking at least a portion of the microwave energy emitted from the aperture means. The shutter means is adapted to ensure that a substantially uniform density of microwave energy is emitted from the aperture means.

An embodiment of the shutter means is shown in FIG. 3 as an elongated straight or slightly curved metallic microwave shutter 150 affixed to the waveguide 142 by a single connection 152 consisting of, for example, a pin 153 through a channel 155, on the side of the waveguide 142 nearest to the source of microwave energy. Disposed at the opposite end of the single aperture 146, and along the edges of aperture 146, are dielectric insulator means 154 fabricated from, for example glass or teflon. The dielectric insulator means 154 are adapted to form an insulating barrier between the waveguide 142 and the microwave shutter 150. This is necessary since the microwave shutter 150 may be grounded to the waveguide 142 only at the connection 152. Additional contact between the shutter 150 and the waveguide 142 will cause a "sizzling" ground, i.e., an arcing contact.

As stated above, the microwave applicator of the present invention is preferably adapted to radiate microwave energy via nonevanescent waves. The embodiments of the microwave applicator shown and discussed in detail in connection with FIGS. 2, 3 and 4, 5a, 5b, and 5c are of the type generally known as "leaky" microwave structures in that microwave energy is allowed to leak or radiate through the aperture means described above. Alternatively, the microwave applicator may be adapted to radiate microwave energy as evanescent waves. This is known as a "slow wave" structure. This type of microwave applicator was discussed above with reference to the Weissfloch and Kieser patents.

As discussed above, the microwave applicator further includes a volume of dielectric material disposed within the waveguide. The volume may be of any shape or form. The volume of dielectric material may either partially or totally fill the interior of the waveguide. Furthermore, it may be a single continuous volume of material or a plurality of discontinuous volumes. FIG. 4 shows the rectangular waveguide 42 from FIG. 2. In FIG. 4, the waveguide 42 is totally filled with a volume of dielectric 182.

Generally, a dielectric material is characterized by both a relative dielectric constant and a dielectric loss tangent. The dielectric loss tangent is a measure of the electric energy lost as heat energy when microwaves propagate within the dielectric material. In the present invention, the volume of dielectric material is preferably formed from material having a relative dielectric constant greater than or equal to about 2.0. More preferably, the volume of dielectric material is formed from material having a relative dielectric constant greater than or equal to about 2.5. Most preferably, the volume of dielectric material is formed from material having a relative dielectric constant greater than or equal to about 3.0. Generally, any low loss dielectric known in the art having the appropriate relative dielectric constant may be used. Preferably, the volume of dielectric material is formed from material having a dielectric loss tangent less than or equal to about 0.10. More preferably, the volume of dielectric material is formed from material having a dielectric loss tangent less than or equal to about 0.08.

The volume of dielectric material may be formed from a single material having a uniform relative dielectric constant and a uniform dielectric loss factor. Alternatively, the volume of dielectric material may be formed from a plurality of dielectric materials having various relative dielectric constants and/or various dielectric loss factors. Examples of dielectric materials which may be used include, but are not limited to, alumina, a mixture of alumina and silicon dioxide, titania, yttrium iron garnet, yttrium aluminum garnet, or polytetrafluoroethylene.

As mentioned above, the volume of dielectric material functions as a means for controlling the cutoff wavelength of the microwave applicator. Generally, for each mode of operation of a waveguide (i.e. $TE_{m,n}$ and $TM_{m,n}$ modes) there is a "cutoff" wavelength associated with the cross-sectional dimensions of the waveguide. Microwaves having a wavelength longer than the cutoff will not propagate within the waveguide. For example, for the $TE_{1,0}$ mode for a rectangular waveguide, the cutoff wavelength is equal to twice the wide dimension of the cross-section of the waveguide. This means that at frequencies where the wavelength is longer than twice the wide dimension, there can be no propagation in the waveguide.

One way of increasing the cutoff wavelength of a waveguide is by increasing the waveguide's cross-sectional dimensions. Another way of increasing the cutoff wavelength is by placing dielectric material within the interior of the waveguide. Placement of dielectric material within the waveguide increases the cutoff wavelength and permits the propagation of microwave energy having longer wavelength (i.e. lower frequency) than that which could propagate in the same waveguide filled entirely with air. Hence, placement of dielectric material within the waveguide increases the wavelength of the microwave energy that can be used without having to change the physical dimensions of the waveguide. Preferably, the volume of dielectric material placed within the waveguide is chosen to at least double the cutoff wavelength (i.e., two times the cutoff wavelength of waveguide having the same dimensions but without the dielectric material). More preferably, the volume of dielectric material placed within the waveguide is chosen to at least triple the cutoff wavelength (i.e., three times the cutoff wavelength of waveguide with the same dimensions but without the dielectric material).

The microwave applicator disclosed herein can thus be easily adapted for use at different wavelengths of microwave energy. Depending on the wavelength of the microwave source being used, the cutoff wavelength can be adjusted by choosing the appropriate dielectric materials. Hence, the wavelength of the microwave source can be changed without the need to make costly dimensional modifications to the microwave applicator and related components.

Such adaptability is very important, especially when the microwave source being used is a magnetron. The power capability of the magnetron is directly proportional to its size. However, increasing the size of the magnetron also increases the wavelength of the microwave energy produced. Nevertheless, because of the adaptability of the disclosed microwave applicator, the size and lower capability of the magnetron can be quickly and easily increased.

The microwave applicator may be formed from other types of waveguide structures which incorporate dielectric materials as part of their means of propagating microwave energy. Other types of microwave guiding structures that may be used include, but are not limited to stripline, microstrip, slotline and coplanar waveguide.

Figure 5A:
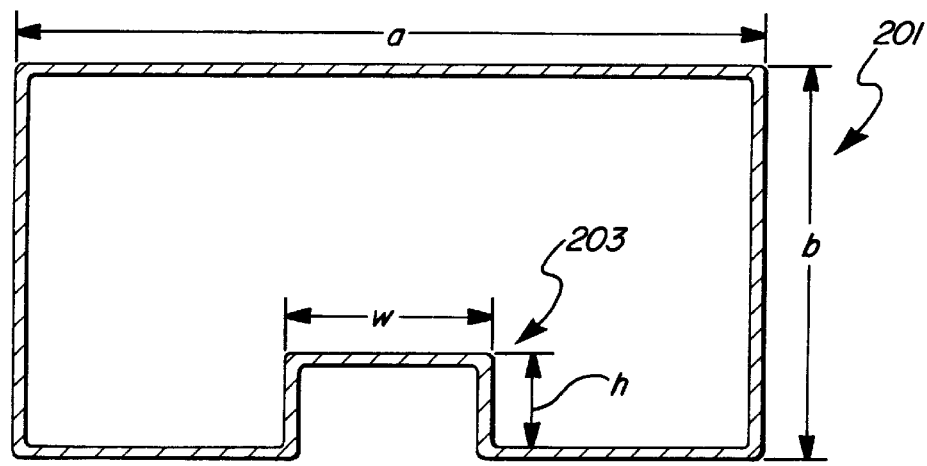
FIG. 5a shows a cross-section of a microwave applicator formed from single-ridge waveguide.
Figure 5B:
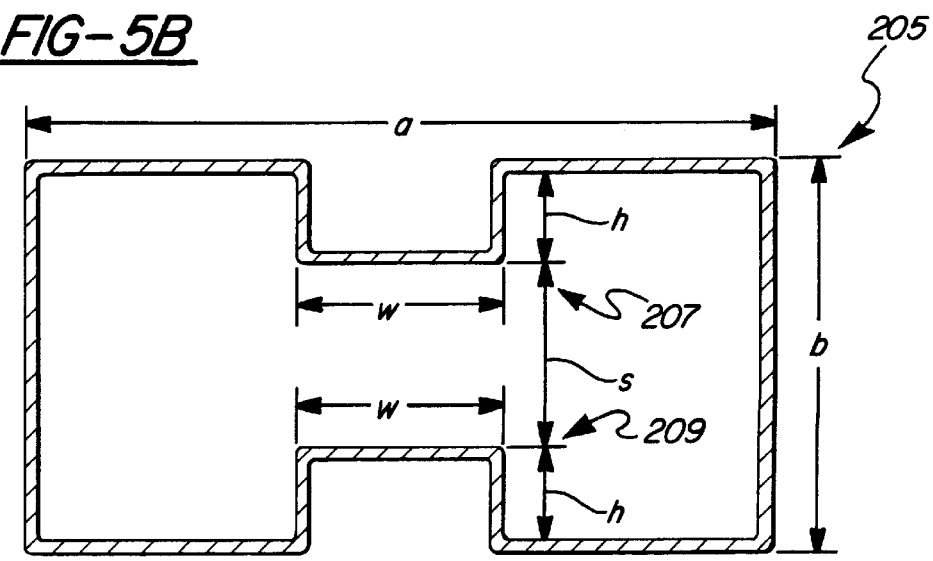
FIG. 5b shows a cross-section of a microwave applicator formed from double-ridge waveguide.

Another embodiment of the microwave applicator of the present invention is a ridge waveguide. The cross-sectional view of a ridge waveguide is shown in FIGS. 5a and 5b. FIG. 5a shows the cross-section of a single-ridge waveguide 201, and FIG. 5b shows the cross-section of a double-ridge waveguide 205. As shown in FIGS. 5a and 5b, the cross-section of the single-ridge waveguide 201 and double-ridge waveguide 205 is rectangular having wide dimension (width) "a" and short dimension (height) "b". The center section of the single-ridge waveguide 201 has a single ridge 203 of width "w" and height "h". The center section of the double-ridge waveguide 205 has ridges 207, 209, each of width "w" and height "h". In each case, the ridges are centered along the wide dimension of the cross-section of the waveguide. For double-ridge waveguide 205, there is spacing "S" between the two ridges 207, 209. As used herein, reference to "ridge waveguide" includes both single-ridge waveguide and double-ridge waveguide.

The ridge waveguide has a much higher cutoff wavelength for the same width and height as does the conventional rectangular waveguide. Furthermore, the cutoff wavelength may be adjusted by changing the width and height of the ridges. Hence, the ridges function as means for controlling the cutoff wavelength of the microwave applicator. Preferably, the ridges are adapted to increase the cutoff wavelength by at least a factor of two (i.e., two times the cutoff wavelength of waveguide having the same dimensions "a" and "b" but without the ridges). More preferably, the ridges are adapted to increase the cutoff wavelength by at least a factor of three (i.e., three times the cutoff wavelength of waveguide having the same dimensions "a" and "b" but without the ridges). Preferably, the interior of the ridge waveguide is filled with air. However, a volume of dielectric material may be placed in the interior of the ridge waveguide to provide increased control of the cutoff wavelength.

The ridge waveguide further includes aperture means, formed in the surface of the ridge waveguide, for emitting microwave energy into the interior of the vessel. Preferably, the aperture means is adapted to uniformly radiate microwave energy into the vacuum vessel.

The aperture means may be a single aperture that is elongated along the longitudinal extent of the waveguide surface. The single aperture may be formed through substantially the entire length and width of a single face of the ridge waveguide.

Alternately, the aperture means may be a plurality of apertures which are spacedly positioned along the longitudinal extent of the waveguide surface. The aperture means may be positioned on a single face of the ridge waveguide surface, or on more than one of the faces of the ridge waveguide surface. One or more of the apertures may be totally or partially blocked to control the density and distribution of microwave energy radiating from the ridge waveguide. FIG. 5c shows a single-ridge waveguide 240 with ridge 244. In this embodiment, single-ridge waveguide 240 has an aperture means comprising a plurality of apertures 246, 248, 250, 252, and 254. Apertures 246 and 248 are shown blocked.

In this embodiment, the apertures are all located on the side of the waveguide opposite the ridge. However, in general, apertures may be located anywhere on the surface of the waveguide. A shutter means, discussed above, may be used for blocking at least a portion of the microwave energy emitted from the aperture means of the ridge waveguide. Preferably, the shutter means is adapted to uniformly radiate the microwave energy.

Another embodiment of the microwave applicator of the present invention is a "finline" waveguide. The finline waveguide is a waveguide containing a dielectric substrate in the electrical symmetry plane upon which conducting strips separated by a slot are deposited.

As shown in FIG. 1, the apparatus 10 further comprises isolating means 60 for isolating the microwave applicator 40 from the plasma region 20 within the vacuum vessel 12. The isolating means 60 is preferably fabricated from a dielectric material which is substantially transparent to microwave energy. A preferred material is quartz, although other materials may be used.

The isolating means 60 is preferably shaped to withstand forces due to the presence of a pressure differential. More preferably, the isolating means is cylindrically or hemi-cylindrically shaped. A cylindrical or hemi-cylindrical shape may be made thinner than a planar shape due to the strength inherent in a cylinder. A thin cylinder is capable of withstanding pressures which would require a much thicker planar plate.

Furthermore, minimizing the thickness of the isolating means provides for effective thermal cooling so that high power microwave energy may be employed without deleteriously effecting the isolating means. A thin cylinder isolating means may be maintained at a relatively low temperature and may be uniformly cooled to prevent thermal degradation. It thus does not impose practical limitations upon the amount of power which may be applied.

The microwave applicator 40 should be disposed within the isolation means 60 and spaced apart from the circumferential wall of the isolation means. The microwave applicator 40 may thus extend partially through the vacuum vessel 12, without being exposed to the plasma region 20 contained therein.

The cylindrical isolating means 60, shown in FIG. 1, is configured so as to be coextensive with at least one dimension of the vacuum vessel 12, and protrude through at least a first and second wall portion of the vacuum vessel 12. The cylindrical isolating means 60 is fixed through the walls of the vacuum vessel 12 by means of two collar fittings 62 and 64. Collar fittings 62 and 64, like reaction vessel 12 are preferably fabricated from a suitable non-corrosive material such as stainless steel, with the collar fittings 62 and 64 preferably being mountably joined to the vessel 12. Collar fitting 62 comprises an open end portion 66 extended from a connection flange 68. Connection flange 68 is affixed directly to a side wall of the vacuum vessel 12, and includes an opening 70 co-extensive with the circumference of the cylindrical isolating means 60 and adapted to receive cylindrical isolating means 60. Open end portion 66 extends from the connection flange 68, and is adapted to receive at least two O-rings 72, 74. O-rings 72, 74 are adapted to effect a vacuum and water barrier between the interior of said vacuum vessel 12 and outside ambient conditions. Between O-rings 72, 74 is disposed a cooling channel 73, through which a cooling medium such as water may be circulated so as to maintain the O-rings at a uniformly low temperature. The O-rings 72, 74 are preferably adapted to maintain the vacuum and water seal at substantially elevated temperatures, i.e., temperatures in excess of 100 degree(s) Centigrade.

The cylindrical isolating means 60 passes through opening 70, connection flange 68, and the open end portion 66. In this way, O-rings 72, 74 are urged against the outside circumference of the cylindrical isolating means 60. The compression of the O-rings 72, 74 against the cylindrical isolating means 60 results in an air tight, water tight seal. It is important to note that the location of O-rings 72, 74 is well outside the plasma region 20 of the apparatus 10. This is noteworthy because by keeping the O-rings out of the plasma region 20, they are not exposed to the excessive temperatures associated with microwave plasmas, i.e., temperatures in excess of 500 degree(s) centigrade. Had the O-ring seals been located within the plasma region, as shown in the aforementioned U.S. Pat. No. 4,729,341, special (and costly) high temperature resistant seals would have been required, greatly increasing the complexity and cost of the apparatus 10.

The cylindrical isolating means 60 may extend beyond the outside terminal edge of said open end portion 66. This portion of the cylindrical isolating means 60 must thus be equipped with microwave containment means 80. The microwave containment means 80 is typically fabricated from a metal microwave containment canister operatively affixed around the outside circumference of the cylindrical isolating means 60, and in electrical contact with the open end portion 66 by grounding fingers 82. The microwave containment canister is fabricated so as to be coextensive with that portion of the cylindrical isolating means 60 which extends beyond the open end portion 66. Additionally, the microwave containment means 80 further includes an open end portion 84 over which is disposed a metallic microwave blocking mesh 86 adapted to contain stray microwaves therewithin. The mesh 86 is also adapted to allow for the passage of a flux of cooling air through the cylindrical isolating means 60. Alternatively, and as is illustrated in phantom in FIG. 1, the open end portion 84 of the microwave containment canister 80 may be attached to a dummy load adapted to absorb excess microwave radiation. This embodiment is particularly useful at high power levels, where excess reflected microwave energy causes reflection modes which may degrade the uniformity of the microwave plasma.

The vacuum vessel 12 is further adapted to receive the cylindrical isolating means 60 through at least a second wall portion thereof, preferably the wall portion opposite the wall portion upon which collar fitting 62 is mounted. Collar fitting 64 is disposed on said opposite wall position, substantially in line with collar fitting 62. Collar fitting 64 comprises an open end portion 90 extended from a connection flange 92. Connection flange 92 is affixed directly to the opposite wall portion and includes an opening 94 co-extensive with the circumference of the cylindrical isolating means 60, and adapted to receive the isolating means 60. The open end portion 90 extends from the connection flange 92, and is adapted to receive at least two O-rings 96, 98 which are adapted to effect a vacuum and water barrier between the plasma region 20 within the vacuum vessel 12 and the surrounding ambient conditions. Between O-rings 96, 98 is disposed a cooling channel 97, through which a cooling medium such as water may be circulated so as to maintain the O-rings at a uniformly low temperature. The O-rings 96, 98 like O-rings 72, 74 are adapted to withstand elevated temperatures. The cylindrical isolating means 60 is passed through opening 94, through connection flange 92 and open end portion 90 whereby O-rings 96, 98 are urged against the outside circumferential edge of said cylindrical isolating means 60. The compression of said O-rings is the mechanism by which an air tight, water tight seal is effected. Also, O-rings 96, 98, like O-rings 72, 74, are well out of the plasma region 20, and therefore not subjected to degradation.

By effecting an air-tight, water tight seal around the outer circumference of the cylindrical isolating means 60, it is possible to maintain the plasma region 20 at substantially sub-atmospheric pressures, while the interior of the cylindrically isolating means 60 is maintained at atmospheric pressures, and is directly exposed to ambient conditions. This is in fact an advantage in the operation of the apparatus 10. By maintaining the vacuum vessel at sub-atmospheric pressures, it is possible to operate the apparatus 10 at a pressure approximating that required for operation near the minimum of a modified Paschen curve. Additionally, the low pressures allow for a longer mean free path of travel for the plasma species, thereby contributing to overall plasma uniformity. Since the interior of the cylindrical isolating means 60 is exposed to ambient conditions, a flux of cooling air may be maintained therethrough so as to prevent the excessive heating which may be associated with microwave plasmas. Alternatively, a microwave transmissive cooling medium such as silicon oil may be circulated within the cylinder to maintain a uniform, cool temperature. The cylindrical isolating means 60, extending beyond the open end portion 90 must be sheathed within a metallic microwave containment means 100, of the type described hereinabove. The microwave containment means 100 is disposed adjacent to connection plate 102 which affects a connection between the microwave applicator 40, and a source of microwave energy.

Figure 6:
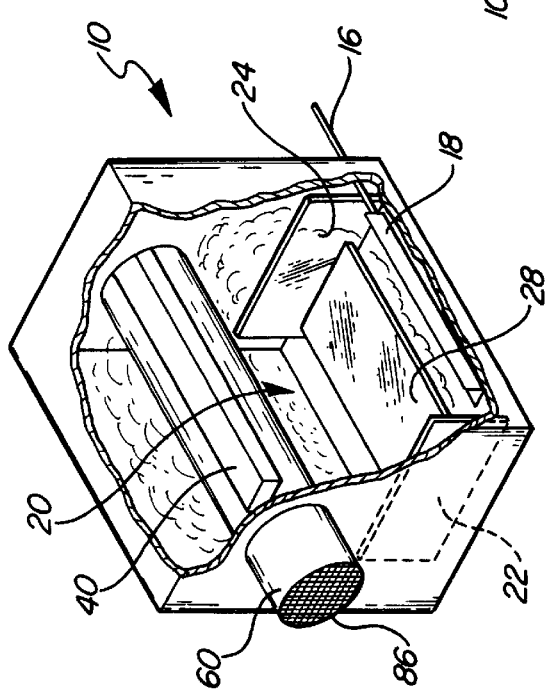
FIG. 6 shows a vacuum vessel with a single, elongated substrate operatively disposed relative to the radiative microwave applicator so as to have a plasma operation performed on the upper surface thereof.

As described hereinabove, and as is illustrated in FIG. 1, the apparatus 10 defines a plasma region 20 into which is disposed a substrate, at a distance not in excess of the distance defined by the near field distance of the microwave applicator 40. In a first embodiment, and as is illustrated in FIG. 6 where like reference number refer to like structures, the substrate 28 disposed into said plasma region 20 may take the form of a single, elongated planar or slightly curved substrate member. Said planar substrate member 28 is operatively disposed between the process gas containment means 22, 24 and within the near field distance of the microwave applicator 40.

Figure 8:
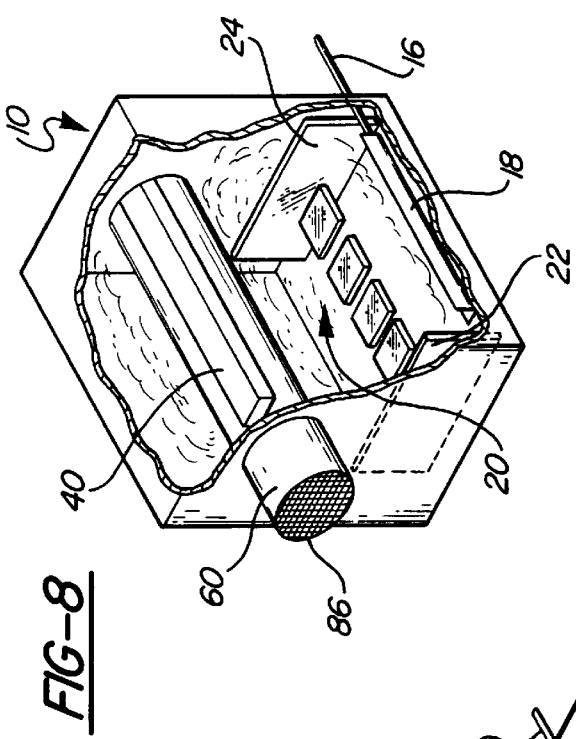
FIG. 8 shows a vacuum vessel with a plurality of spaced substrates disposed relative to the microwave applicator so as to have a plasma operation performed on the upper surfaces thereof.
Figure 7:
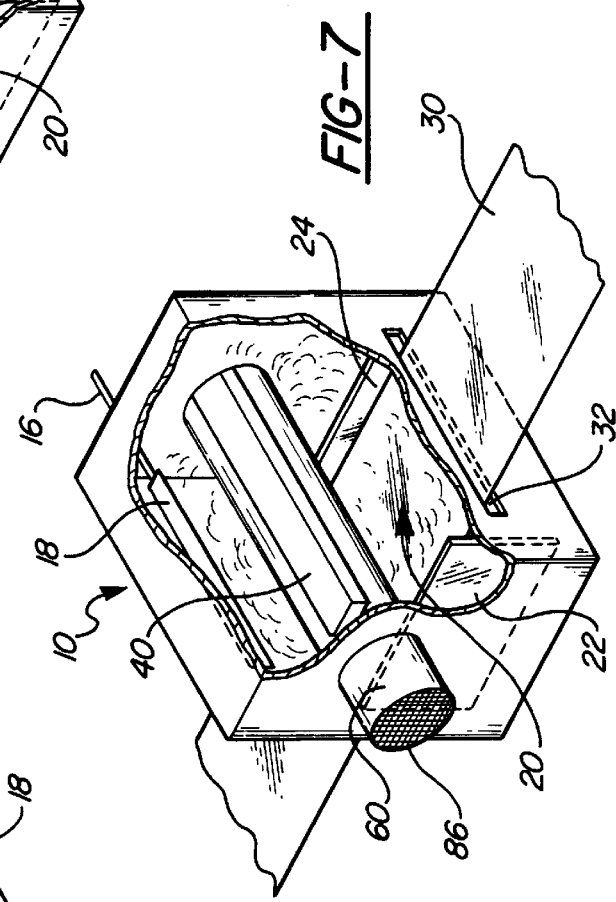
FIG. 7 shows a vacuum vessel with a continuous web of substrate material disposed relative to the microwave applicator so as to have a plasma operation performed on the upper surface thereof.

In another embodiment illustrated in FIG. 7, the substrate member may take the form of an elongated, substantially continuous roll of substrate material 30. In the case of a continuous roll of substrate the apparatus 10 is modified so as to allow the continuous progress of substrate material therethrough. Required modifications would include gate means 32 adapted to allow the free passage of the substrate member into and out of the vacuum vessel 12, while maintaining the vacuum and containing both the process gases and the microwave plasma. A preferred gate means 32 for containing the reaction gases and microwave plasma within the vacuum vessel 12 is disclosed in U.S. Pat. No. 4,438,723 to Cannella, et al, the disclosure of which is incorporated herein by reference. In yet another embodiment, and as is illustrated in FIG. 8, the substrate comprises a plurality of individual work pieces 34 supported in the plasma region 20 by substrate support means 26, and operatively disposed so as to have a plasma operation performed upon the upper surfaces thereof.

As was discussed hereinabove, while each embodiment is illustrated with the substrate members 28 disposed below the microwave applicator 40, due to the substantially uniform nature of the plasma, the plasma region may be located anywhere within the near field distance of the microwave applicator 40. The input gas manifold 18 may provide into the plasma region 20 a process material as metallic material, semiconductor material, and dielectric material upon the substrate. In yet another embodiment, the precursor gases introduced into the plasma region decompose and deposit a clear, hard film onto the substrate. In another embodiment, at least one etchant precursor gas may be introduced into the plasma region 20, whereby the apparatus 10 is adapted to etch the surface of a substrate means located therewithin.

While the invention has been described in connection with preferred embodiments and procedures, it is to be understood that it is not intended to limit the invention to the described embodiments and procedures. On the contrary it is intended to cover all alternatives, modifications and equivalence may be included within the spirit and scope of the invention as defined by the claims appended herein and after.

What is claimed is:

1. Microwave apparatus for sustaining a substantially uniform plasma over a relatively large area, comprising:

a vacuum vessel for sustaining said plasma in a plasma region thereof;

means, within said vacuum vessel, for supporting a substrate in juxtaposition to said plasma region;

means for maintaining said vacuum vessel at a desired pressure;

means for introducing pressure gases into said vacuum vessel; and a nonevanescent microwave applicator including a volume of dielectric material for increasing the cutoff wavelength thereof, said applicator extending at least partially within said vacuum vessel and leaking microwave energy from a source into the interior of said vessel so as to maintain said plasma.

2. The microwave apparatus of claim 1, wherein said applicator comprises:

a waveguide having an elongated surface extending along a longitudinal axis thereof, said waveguide having aperture means formed in said surface for emitting said microwave energy, said volume of dielectric material disposed within said waveguide.

3. The microwave apparatus of claim 2, wherein said aperture means includes a plurality of apertures spacedly positioned along the longitudinal extent of said surface.

4. The microwave apparatus of claim 2, wherein said aperture means includes a single aperture.

5. The microwave apparatus of claim 4, wherein said single aperture is elongated along the longitudinal extent of said surface.

6. The microwave apparatus of claim 2, wherein said aperture means is adapted to uniformly radiate said microwave energy from said waveguide.

7. The microwave apparatus of claim 2, wherein said applicator further comprises shutter means for blocking at least a portion of said microwave energy emitted from said aperture means.

8. The microwave apparatus of claim 2, wherein said waveguide is selected from the group consisting of rectangular waveguide, square waveguide, circular waveguide, and elliptical waveguide.

9. The microwave apparatus of claim 1, wherein said dielectric material has a dielectric constant greater than or equal to about 2.0.

10. The microwave apparatus of claim 1, wherein said dielectric material has a dielectric constant greater than or equal to about 3.0.

11. The microwave apparatus of claim 1, wherein said dielectric material has a loss-tangent less than or equal to about 0.10.

12. The microwave apparatus of claim 1, wherein said dielectric material is selected from the group consisting of alumina, a mixture of alumina and silicon dioxide, titania, yttrium iron garnet, and polytetrafluroethylene.

* * * * *